(12) United States Patent
Rodder et al.

(10) Patent No.: US 6,258,644 B1
(45) Date of Patent: Jul. 10, 2001

(54) MIXED VOLTAGE CMOS PROCESS FOR HIGH RELIABILITY AND HIGH PERFORMANCE CORE AND I/O TRANSISTORS WITH REDUCED MASK STEPS

(75) Inventors: Mark S. Rodder, University Park; Manoj Mehrotra, Dallas; Mahalingam Nandakumar, Richardson, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/499,719

(22) Filed: Feb. 8, 2000

Related U.S. Application Data

(60) Provisional application No. 60/118,979, filed on Feb. 8, 1999.

(51) Int. Cl.⁷ ............................................... H01L 21/8238
(52) U.S. Cl. .......................................... 438/199; 438/270
(58) Field of Search ........................... 438/197, 199, 438/216, 542, 543, 546, 547, 548, 259, 257, 266, 270

(56) References Cited

U.S. PATENT DOCUMENTS

| | | | | |
|---|---|---|---|---|
| 5,416,736 | * | 5/1995 | Kosa et al. ............................ | 365/174 |
| 5,465,001 | * | 11/1995 | Skotnicki et al. .................... | 257/370 |
| 5,932,918 | * | 8/1999 | Krakauer .............................. | 257/368 |
| 6,075,271 | * | 6/2000 | Smith ................................... | 257/373 |

* cited by examiner

Primary Examiner—David Nelms
Assistant Examiner—David Nhu
(74) Attorney, Agent, or Firm—Peter K. McLarty; W. James Brady, III; Frederick J. Telecky, Jr.

(57) ABSTRACT

A mixed voltage CMOS process for high reliability and high performance core transistors and input-output transistors with reduced mask steps. A gate stack (30) is formed over the silicon substrate (10). Ion implantation is performed of a first species and a second species to produce the doping profiles (70, 80, 90, 100) in the input-output transistors.

22 Claims, 2 Drawing Sheets

MIXED VOLTAGE CMOS PROCESS FOR HIGH RELIABILITY AND HIGH PERFORMANCE CORE AND I/O TRANSISTORS WITH REDUCED MASK STEPS

This application claims priority under 35 USC § 119(e)(1) of provisional U.S. application No. 60/118,979 Feb. 8, 1999.

FIELD OF THE INVENTION

The invention is generally related to the field of MOSFET transistors and more specifically to a novel process to achieve high performance core transistor performance and high I/O transistor reliability with reduced mask steps.

BACKGROUND OF THE INVENTION

For mixed voltage technologies, e.g. low voltage core transistors with operating voltages of about 1.8 volts to 1.2 V and high voltage input-output (I/O) transistors with operating voltages of about 3.3 volts to 2.5 volts, it is difficult to achieve both high reliability and high performance for both the core transistors and the I/O transistors without adding extra mask steps to independently optimize the core transistors and the I/O transistors.

The higher operating voltages of the I/O transistors make them susceptible to hot carrier degradation. To reduce this effect, a lightly doped drain (LDD) or drain extension is utilized. In this disclosure, LDD will be used to represent any drain extension type implant. The drain extension typically extend the heavily doped source and drain regions further under the gate of the transistor. In some applications, this LDD is formed using a low dose, high energy arsenic implant which results in acceptable reliability for the high voltage NMOS I/O transistor. In an effort to reduce masking steps, this low dose, high energy arsenic implant can also be used to form the LDD structure in the low voltage core NMOS transistor. However, this LDD structure will significantly degrade the core NMOS transistor drive current ($I_{drive}$), most notably, as the drain supply voltage (VDD) for the core is scaled down from about 1.8 volts to about 1.2 volts. This drive current degradation is most probably due to the increase in the series resistance ($R_sR_d$) present in the source and drain and the associated LDD structure. As the drain supply voltage is reduced, the drive current will become increasingly limited by the this series resistance.

Thus the LDD structure required for achieving high reliability in the high voltage NMOS I/O transistors will severely degrade the $I_{drive}$ in the low voltage NMOS core transistors due to high series resistance $R_sR_d$ and damage from the high energy arsenic implant. Present integrated circuit fabrication methodologies necessitates the use of additional masking steps to separately optimize both transistors. There is therefore great need for a reduced masking step process that will optimize both transistors and result in both high reliability and high performance without the high cost associated with increased masking steps.

SUMMARY OF THE INVENTION

The instant invention is a mixed voltage CMOS method for high reliability and high performance core and input-output transistors with reduced masks.

An embodiment of the instant invention is a method of making a reliable NMOS input-output transistor comprising the steps of: forming at least one region of a second conductivity type in a semiconductor substrate of a first conductivity type; forming a gate dielectric of a first thickness on said semiconductor substrate; forming a gate dielectric of a second thickness on said semiconductor substrate wherein said gate dielectric of a second thickness is equal to or thicker than said gate dielectric of a first thickness; forming a first conductive layer on said gate dielectric of a first thickness; forming a second conductive layer on said gate dielectric of a second thickness; etching said first conductive layer and said gate dielectric of a first thickness to form a first transistor gate stack on said semiconductor substrate of a first conductivity type; etching said first conductive layer and said gate dielectric of a first thickness to form a second transistor gate stack on said semiconductor substrate of a second conductivity type; etching said second conductive layer and said gate dielectric of a second thickness to form a third transistor gate stack on said semiconductor substrate of a first conductivity type; simultaneously implanting said first transistor gate stack and said third transistor gate stack with a first implant of a first species type; simultaneously implanting said first transistor gate stack and said third transistor gate stack with a second implant of a second species type; simultaneously implanting said second transistor gate stack and said third transistor gate stack with a third implant of said first species type; and simultaneously implanting said second transistor gate stack and said third transistor gate stack with a fourth implant of said second species type. Preferably, the first conductivity type is p-type and the second conductivity is n-type. The first implant species type is comprised of a material selected from the group consisting of: B, BF2, Ga, In, and any combination thereof, and the second species type is comprised of a material selected from the group consisting of: As, P, Sb, and any combination thereof.

Another embodiment of the instant invention is a method of fabricating a mixed voltage integrated circuit, comprising the steps of: forming at least one region of a second conductivity type in a semiconductor substrate of a first conductivity type opposite said second conductivity type; forming a gate dielectric on said semiconductor substrate; forming a conductive layer on said gate dielectric; etching said conductive layer and said gate dielectric to form a first transistor gate stack on said semiconductor substrate and a second transistor gate stack on said one region of said second conductivity type; and simultaneously implanting said first transistor gate stack and said second transistor gate stack with a pocket implant for said first transistor gate stack whereby said pocket implant for said first transistor gate stack functions as LDD implant for said second gate stack.

An advantage of the instant invention is that no masking steps are required for forming the mixed voltage integrated circuits. Another advantage of the instant invention is that no additional implants are required other than those required for forming the core transistors. Another advantage of the instant invention is that the pocket implant of one transistor device type will be used as the drain extension of the other transistor device type.

These and other advantages will be apparent to those of ordinary skill in the art having reference to the specification in conjunction with the drawings.

Figure 1A:
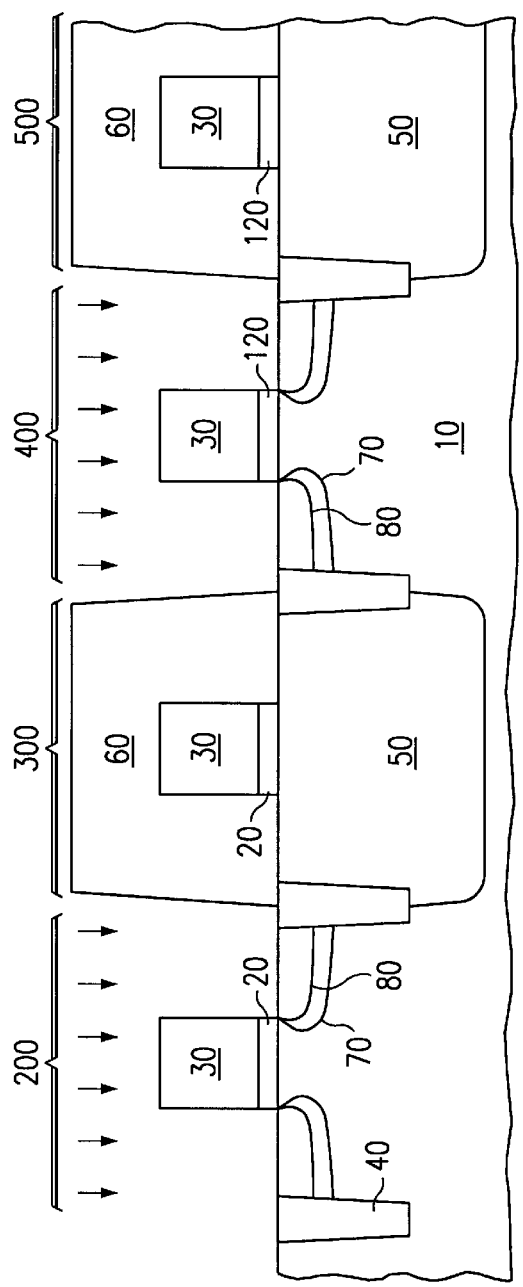
FIGS. 1A–1B are cross-sectional diagrams at various steps in the fabrication of the I/O transistor.

Common reference numerals are used throughout the figures to represent like or similar features. The figures are not drawn to scale and are merely provided for illustrative purposes.

DETAILED DESCRIPTION OF THE INVENTION

Figure 1B:
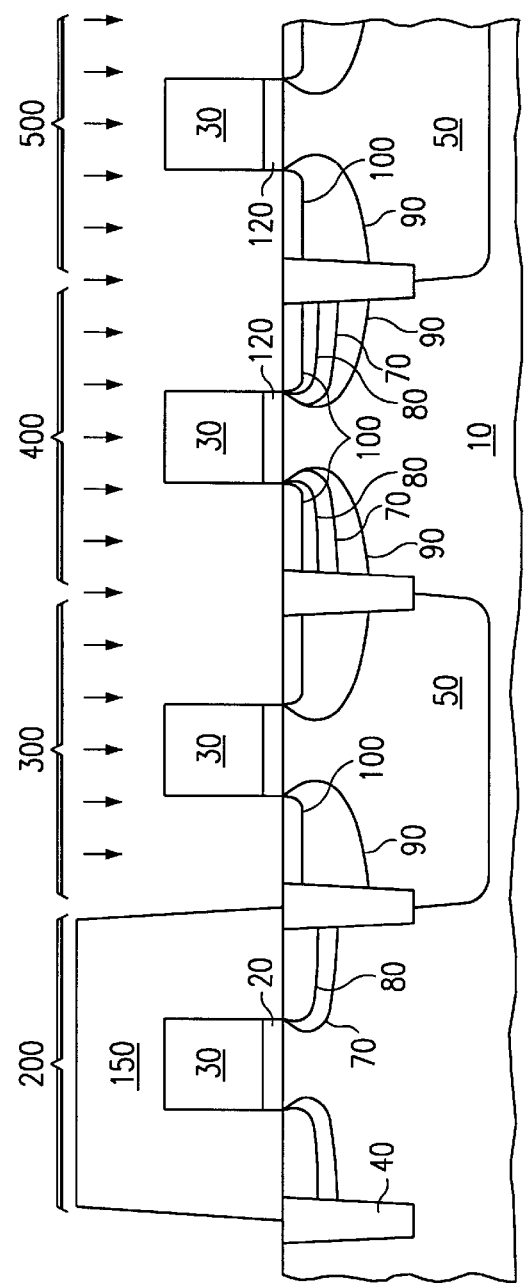
Figure 2:
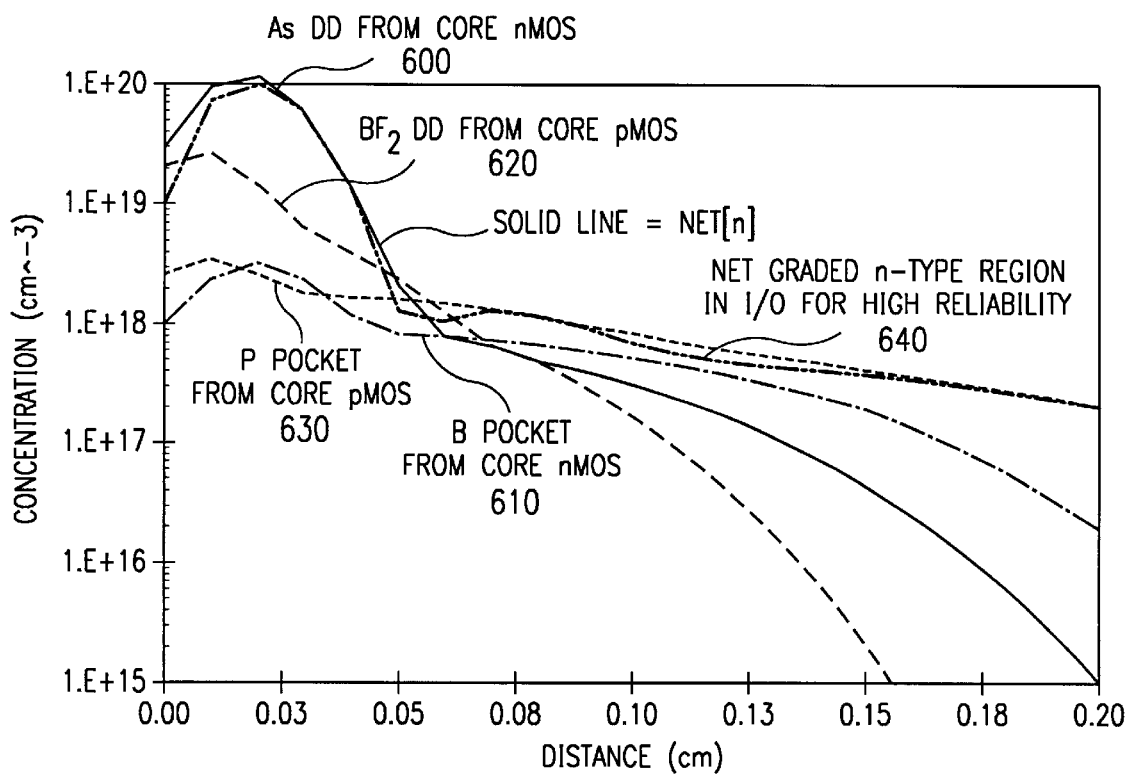
FIG. 2 shows the doping profile obtained from a particular embodiment of the invention.
Figure 3:
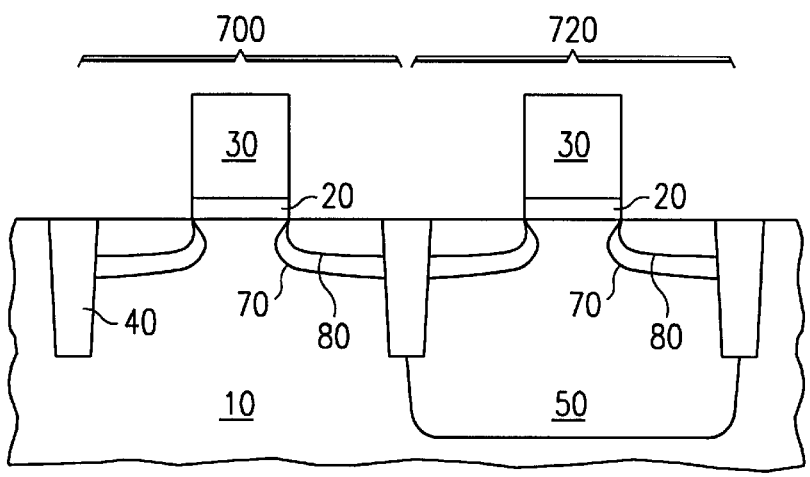
FIG. 3 shows the doping profile obtained from a particular embodiment of the invention.

While the following description of the instant invention revolves around FIGS. 1–3, the instant invention can be utilized in any semiconductor device structure. The methodology of the instant invention provides a solution to obtain a reliable high voltage NMOS I/O transistor simultaneously with a high performance, low voltage NMOS core transistor with no extra mask steps.

The method of the instant invention will result in the following key features of the core NMOS transistor and the I/O NMOS transistor;

a) The NMOS core transistor will preferably have shallow drain extensions of sufficiently high dose for low $R_sR_d$, and very little dopant grading to support the required minimum gate length ($L_{g\ min}$)
b) The NMOS I/O transistor will preferably have a drain extension of sufficient doping grading for high NMOS I/O reliability and sufficiently low $R_sR_d$ for acceptable performance.

The above key features are achieved by the instant invention with no additional mask steps.

The following description of the instant invention will be related to FIGS. 1–2. Referring to FIGS. 1A and 1B, substrate 10 is provided and a gate dielectric 20 is formed on substrate 10. The substrate 10 is preferably p-type in conductivity, but n-type substrates can also be used. Gate dielectric 20 may be comprised of an oxide, thermally grown SiO2, a nitride, an oxynitride, or any combination thereof, and is preferably on the order of 1 to 10 nm thick. A layer of silicon containing material (which will be patterned and etched to form gate structure 30) is formed on gate dielectric 20. Preferably, this silicon-containing material is comprised of polycrystalline silicon("poly" or "polysilicon"), but it may be comprised of epitaxial silicon or any other semiconducting material. Contained in the substrate will be isolation structures 40. These isolation structures may comprise an oxide or some other insulator. The purpose of the isolation structure 40 is to isolate the actives devices from one another on the substrate. The substrate will contain wells 50 that will be of the opposite conductivity type when compared to the conductivity of the substrate.

For the embodiment of the instant invention shown in FIGS. 1A and 1B, the substrate 10 is p-type and the well 50 is n-type. The core NMOS transistor will be fabricated in region 200, the core PMOS transistor in region 300, the I/O NMOS transistor in region 400, and the I/O PMOS transistor in region 500. The gate dielectric for the I/O transistors 120 will be thicker than the gate dielectric 20 for the core transistors. With the gate structures 30 defined, a layer of photoresist is formed over the substrate 10. Using standard photolithographic techniques, the resist is patterned and etched to produce the areas of resist 60 that cover the PMOS core and I/O transistor. A blanket pocket p-type implant followed by a blanket n-type LDD implant is performed resulting in the p-type doping profile 70, and the n-type doping profile 80. In current integrated circuit technology, pocket implants refer to an implant that is used to reduce the effect of the short transistor gate length on transistor properties such as threshold voltage. The effect of the pocket implant is not however limited to threshold voltage. The pocket implant for a particular transistor type usually results in a doping profile that extends beyond the drain extension of the transistor. The species of the p-type pocket implant can consist of B, BF2, Ga, In, or any other suitable p-type dopant. The species of the n-type LDD implant can consist of As, P, Sb, or any other suitable n-type dopant. The order of the implants is somewhat arbitrary and the LDD implant could be performed before the pocket implant. After the completion of the p-type pocket implant, the n-type LDD implant, and any subsequent processing if required, the photoresist 60 is removed using standard processing techniques. Following the removal of the photoresist any number of processes may be performed.

Referring to FIG. 1B, a layer of photoresist is formed on the substrate 10, patterned and etched to form the structure 150 which covers the NMOS core transistor. A blanket pocket n-type implant followed by a blanket p-type LDD implant is performed resulting in the n-type doping profile 90, and the p-type doping profile 100. The species of the n-type pocket implant can consist of As, P, Sb or any other suitable n-type dopant. The species of the p-type LDD implant can consist of B, BF2, Ga, In, or any other suitable p-type dopant. The order of the implants is somewhat arbitrary and the LDD implant could be performed before the pocket implant. After completion of the implants the integrated circuit is completed using standard CMOS processing techniques.

In a specific embodiment of the instant invention, the following implants were carried out on the NMOS I/O transistor:

| Implant | Condition | Species |
|---|---|---|
| NMOS-LDD | $1.2 \times 10^{15} \text{cm}^{-2}$, 15 keV | As |
| NMOS-pocket | $2.4 \times 10^{13} \text{cm}^{-2}$, 15 keV | B |
| PMOS-LDD | $4 \times 10^{14} \text{cm}^{-2}$, 10 keV | BF2 |
| PMOS-pocket | $3.2 \times 10^{13} \text{cm}^{-2}$, 60 keV | P |

The resulting doping profile is shown in FIG. 2. The NMOS LDD profile is given by 600, the NMOS pocket profile by 610, the PMOS LDD profile by 620, the PMOS pocket profile by 630, and the resulting NMOS I/O transistor profile by 640. This graded region of n-type doping in the NMOS I/O transistor results in a reliable I/O transistor and high performance core transistors without adding mask steps.

In addition to implant conditions, the final profile will be a function of the thermal cycles that the transistor undergoes during processing. In determining the implant condition that result in the optimal doping profile, the thermal cycles should be factored into the determination.

A further embodiment of the instant invention is shown in FIG. 3. Here a NMOS transistor 700 and a PMOS transistor 720 are illustrated. These transistors (700 AND 720) could be either core transistors or I/O transistors. In FIG. 3, a blanket pocket p-type implant followed by a blanket n-type LDD implant is performed resulting in the p-type doping profile 70, and the n-type doping profile 80. The species of the p-type pocket implant can consist of B, BF2, Ga, In, or any other suitable p-type dopant. The species of the n-type LDD implant can consist of As, P, Sb, or any other suitable n-type dopant. The order of the implants is somewhat arbitrary and the LDD implant could be performed before the pocket implant. In this embodiment, both transistor types receive both implants. The p-type pocket implant for the NMOS transistor 70 will be used as the LDD implant in the PMOS transistor. The n-type LDD implant in the NMOS transistor 80 will be used as the pocket implant in the PMOS transistor. Following these processes, any number of processing steps may be performed to completely fabricate the devices. While this embodiment has been described with respect to a p-type pocket implant and a n-type LDD implant, the method described is equally applicable to n-type pocket and p-type LDD implants.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method of fabricating a mixed voltage integrated circuit, comprising the steps of:

forming a gate dielectric on a semiconductor substrate;

forming a conductive layer on said gate dielectric;

etching said conductive layer and said gate dielectric to form a transistor gate stack;

implanting said semiconductor substrate adjacent to said transistor gate stack with a first implant of a first conductivity type;

implanting said semiconductor substrate adjacent to said transistor gate stack with a second implant of a second conductivity type opposite that of the first conductivity type; and implanting said semiconductor substrate adjacent to said transistor gate stack with a third implant of said first conductivity type.

2. The method of claim 1, wherein said gate dielectric is comprised of a material selected from the group consisting of: silicon dioxide, silicon oxynitride, silicon nitride, and any combination thereof.

3. The method of claim 1, wherein said conductive layer is comprised of a material selected from the group consisting of: doped polysilicon, undoped polysilicon, epitaxial silicon, and any combination thereof.

4. The method of claim 1, wherein said first implant is comprised of a material selected from the group consisting of: B, BF2, Ga, In, and any combination thereof.

5. The method of claim 1, wherein said second implant is comprised of a material selected from the group consisting of: As, P, Sb, and any combination thereof.

6. The method of claim 1 further comprising the step of implanting said semiconductor substrate adjacent to said transistor gate stack with a fourth implant of said second conductivity type.

7. A method of fabricating a mixed voltage integrated circuit, comprising the steps of:

forming at least one region of a second conductivity type in a semiconductor substrate of a first conductivity type opposite said second conductivity type;

forming a gate dielectric of a first thickness on said semiconductor substrate;

forming a gate dielectric of a second thickness on said semiconductor substrate wherein said second thickness is greater than said first thickness;

forming a first conductive layer on said gate dielectric of a first thickness;

forming a second conductive layer on said gate dielectric of a second thickness;

etching said first conductive layer and said gate dielectric of a first thickness to form a first transistor gate stack on said semiconductor substrate and a second transistor gate stack on said one region of said second conductivity type;

etching said second conductive layer and said gate dielectric of a second thickness to form a third transistor gate stack on said semiconductor substrate;

simultaneously implanting said semiconductor substrate adjacent to said first transistor gate stack and said semiconductor substrate adjacent to said third transistor gate stack with a first implant of a first species type;

simultaneously implanting said first semiconductor substrate adjacent to said transistor gate stack and said semiconductor substrate adjacent to said third transistor gate stack with a second implant of a second species type;

simultaneously implanting said semiconductor substrate adjacent to said second transistor gate stack and said semiconductor substrate adjacent to said third transistor gate stack with a third implant of said first species type; and simultaneously implanting said semiconductor substrate adjacent to said second transistor gate stack and said semiconductor substrate adjacent to said third transistor gate stack with a fourth implant of said second species type.

8. The method of claim 7, wherein said first conductivity type is p-type.

9. The method claim 7, wherein said second conductivity type is n-type.

10. The method of claim 7, wherein said gate dielectric of a first thickness is comprised of a material selected from the group consisting of: silicon dioxide, silicon oxynitride, silicon nitride, and any combination thereof.

11. The method of claim 7, wherein said gate dielectric of a second thickness is comprised of a material selected from the group consisting of: silicon dioxide, silicon oxynitride, silicon nitride, and any combination thereof.

12. The method of claim 7, wherein said first conductive layer is comprised of a material selected from the group consisting of: doped polysilicon, undoped polysilicon, epitaxial silicon, and any combination thereof.

13. The method of claim 7, wherein said second conductive layer is comprised of a material selected from the group consisting of: doped polysilicon, undoped polysilicon, epitaxial silicon, and any combination thereof.

14. The method of claim 7, wherein said first species type is comprised of a material selected from the group consisting of: B, BF2, Ga, In, and any combination thereof.

15. The method of claim 7, wherein said second species type is comprised of a material selected from the group consisting of: As, P, Sb, and any combination thereof.

16. A method of fabricating a mixed voltage integrated circuit, comprising the steps of:

forming at least one region of a second conductivity type in a semiconductor substrate of a first conductivity type opposite said second conductivity type;

forming a gate dielectric on said semiconductor substrate;

forming a conductive layer on said gate dielectric;

etching said conductive layer and said gate dielectric to form a first transistor gate stack on said semiconductor substrate and a second transistor gate stack on said one region of said second conductivity type; and simultaneously implanting said semiconductor substrate adjacent to said first transistor gate stack and said semiconductor substrate adjacent to said second transistor gate stack with a pocket implant for said semiconductor substrate adjacent to said first transistor gate stack whereby said pocket implant for said semiconductor substrate adjacent to said first transistor gate stack functions as a LDD implant for said semiconductor substrate adjacent to said second transistor gate stack.

17. The method of claim 16, wherein said first conductivity type is p-type.

18. The method of claim 16, wherein said second conductivity type is n-type.

19. The method of claim 16, wherein said gate dielectric is comprised of a material selected from the group consisting of: silicon dioxide, silicon oxynitride, silicon nitride, and any combination thereof.

20. The method of claim 16, wherein said conductive layer is comprised of a material selected from the group consisting of: doped polysilicon, undoped polysilicon, epitaxial silicon, and any combination thereof.

21. The method of claim 16, wherein said pocket implant is comprised of a material selected from the group consisting of: B, BF2, Ga, In, and any combination thereof.

22. The method of claim 16 further comprising the step of simultaneously implanting said semiconductor substrate adjacent to said first transistor gate stack and said semiconductor substrate adjacent to said second transistor gate stack with a LDD implant for said semiconductor substrate adjacent to said first transistor gate stack whereby said LDD implant functions as said pocket implant for said semiconductor substrate adjacent to said second transistor gate stack.

* * * * *